US006014930A

United States Patent [19]

Burberry et al.

[11] Patent Number: 6,014,930

[45] Date of Patent: Jan. 18, 2000

[54] SINGLE LAYER DIRECT WRITE LITHOGRAPHIC PRINTING PLATES

[75] Inventors: Mitchell S. Burberry, Webster; Charles D. DeBoer, Palmyra; Mark A. Harris, Rochester, all of N.Y.

[73] Assignee: Kodak Polychrome Graphics LLC, Norwalk, Conn.

[21] Appl. No.: 09/095,812

[22] Filed: Jun. 11, 1998

Related U.S. Application Data

[63] Continuation-in-part of application No. 08/900,743, Jul. 25, 1997, abandoned.

[51] Int. Cl.[7] .................. G03F 7/038

[52] U.S. Cl. .................. 101/456; 101/457; 101/462; 101/467; 430/200; 430/302

[58] Field of Search .................. 101/453, 455, 101/456, 457, 462, 467; 430/200, 201, 302

[56] References Cited

U.S. PATENT DOCUMENTS

| | | | |
|---|---|---|---|
| 3,476,937 | 11/1969 | Vrancken | 101/470 |
| 3,832,948 | 9/1974 | Barker | 101/401.1 |
| 3,964,389 | 6/1976 | Peterson | 101/467 |
| 3,964,906 | 6/1976 | Kenney | 101/465 |
| 4,034,183 | 7/1977 | Uhlig | 219/121.85 |
| 4,054,094 | 10/1977 | Caddell et al. | 101/467 |
| 4,081,572 | 3/1978 | Pacansky | 101/467 |
| 4,731,317 | 3/1988 | Fromson et al. | 430/159 |
| 4,755,445 | 7/1988 | Hasegawa | 101/467 |
| 5,234,890 | 8/1993 | Burberry et al. | 503/227 |
| 5,334,575 | 8/1994 | Noonan et al. | 503/227 |
| 5,372,907 | 12/1994 | Haley | 430/302 |
| 5,460,918 | 10/1995 | Ali et al. | 101/453 |
| 5,569,573 | 10/1996 | Takahashi et al. | 101/453 |
| 5,639,586 | 6/1997 | Hauquier et al. | 101/456 |
| 5,816,162 | 10/1998 | Vermeersch | 101/467 |

FOREIGN PATENT DOCUMENTS

| | | |
|---|---|---|
| 0 562 952 A1 | 9/1993 | European Pat. Off. . |
| 0 573 091 A1 | 12/1993 | European Pat. Off. . |
| 0 573 092 A1 | 12/1993 | European Pat. Off. . |
| 0698503 | 2/1996 | European Pat. Off. . |
| 0 638 728 B1 | 4/1997 | European Pat. Off. . |
| 4442235A1 | 6/1995 | Germany . |
| 105560 | 8/1980 | Japan . |
| 92/09934 | 6/1992 | WIPO . |
| 94/18005 | 8/1994 | WIPO . |
| 97/28007 | 8/1997 | WIPO . |

OTHER PUBLICATIONS

Patent Abstracts of Japan. vol. 017, No. 074 (11–1366) Feb. 15, 1993. (JP 04275195A, Sep. 30, 1992).

Research Disclosure Jan. 1992, #33303, A Lithographic Printing Plate by Vermeersch of Agfa–Gavaert N.V.

*Primary Examiner*—Stephen R. Funk
*Attorney, Agent, or Firm*—Ratner & Prestia

[57] ABSTRACT

A lithographic printing plate made by coating a support web with a coextensive hydrophilic layer of a crosslinked polymeric matrix containing a member of the group consisting of colloids of beryllium, magnesium, aluminum, silicon, gadolinium, germanium, arsenic, indium, tin, antimony, tellurium, lead, bismuth and the transition metal oxides, along with a photothermal conversion material capable of accepting ink when exposed to high intensity radiation.

21 Claims, No Drawings

SINGLE LAYER DIRECT WRITE LITHOGRAPHIC PRINTING PLATES

CROSS REFERENCE TO RELATED APPLICATIONS

This application is a continuation-in-part of U.S. application Ser. No. 08/900,743, filed Jul. 25, 1997, now abandoned. U.S. application Ser. No. 08/816,287, filed Mar. 13, 1997, now abandoned, is incorporated herein by reference.

FIELD OF THE INVENTION

This invention relates in general to lithographic printing plates and particularly to lithographic printing plates which do not require wet processing.

BACKGROUND OF THE INVENTION

The art of lithographic printing is based upon the immiscibility of oil and water, wherein the oily material or ink is preferentially retained by the image area. When a suitably prepared surface is moistened with water and an ink is then applied, the background or non-image area retains the water and repels the ink while the image area accepts the ink and repels the water. The ink on the image area is then transferred to the surface of a material upon which the image is to be reproduced; such as paper, cloth and the like. Commonly the ink is transferred to an intermediate material called the blanket which in turn transfers the ink to the surface of the material upon which the image is to be reproduced.

A very widely used type of lithographic printing plate has a light-sensitive coating applied to an aluminum base support. The coating may respond to light by having the portion which is exposed become soluble so that it is removed in the developing process. Such a plate is referred to as positive-working. Conversely, when that portion of the coating which is exposed becomes hardened, the plate is referred to as negative-working. In both instances the image area remaining is ink-receptive or oleophilic and the non-image area or background is water-receptive or hydrophilic. The differentiation between image and non-image areas is made in the exposure process where a film is applied to the plate with a vacuum to insure good contact. The plate is then exposed to a light source, a portion of which is composed of ultraviolet radiation. In the instance where a positive plate is used, the area on the film that corresponds to the image on the plate is opaque so that no light will strike the plate, whereas the area on the film that corresponds to the non-image area is clear and permits the transmission of light to the coating which then becomes more soluble and is removed. In the case of a negative plate the converse is true. The area on the film corresponding to the image area is clear while the non-image area is opaque. The coating under the clear area of film is hardened by the action of light while the area not struck by light is removed. The light-hardened surface of a negative plate is therefore oleophilic and will accept ink while the non-image area which has had the coating removed through the action of a developer is desensitized and is therefore hydrophilic.

Direct write photothermal litho plates are known as the Kodak Direct Image Thermal Printing Plate. However, they require wet processing in alkaline solutions. It would be desirable to have a direct write photothermal litho plate that did not require any processing.

The prior art has tried to produce such plates by a variety of means. All of them fall short of a plate that has high writing sensitivity, high image quality, short roll up, and long run length without any processing.

U.S. Pat. No. 5,372,907 describes a direct write litho plate which is exposed to the laser beam, then heated to crosslink and thereby prevent the development of the exposed areas and to simultaneously render the unexposed areas more developable, and the plate is then developed in conventional alkaline plate developer solution. The problem with this is that developer solutions and the equipment that contains them require maintenance, cleaning, and periodic developer replenishment, all of which are costly and cumbersome.

U.S. Pat. No. 4,034,183 describes a direct write litho plate without development whereby a laser absorbing hydrophilic top layer coated on a support is exposed to a laser beam to burn the absorber to convert it from an ink repelling to an ink receiving state. All of the examples and teachings require a high power laser, and the run lengths of the resulting litho plates are limited.

U.S. Pat. No. 3,832,948 describes both a printing plate with a hydrophilic layer that may be ablated by strong light from a hydrophobic support and also a printing plate with a hydrophobic layer that may be ablated from a hydrophilic support. However, no examples are given.

U.S. Pat. No. 3,964,389 describes a no process printing plate made by laser transfer of material from a carrier film (donor) to a lithographic surface. The problem of this method is that small particles of dust trapped between the two layers may cause image degradation. Also it takes two sheets to prepare and is more expensive.

U.S. Pat. No. 4,054,094 describes a process for making a litho plate by using a laser beam to etch away a thin top coating of polysilicic acid on a polyester base, thereby rendering the exposed areas receptive to ink. No details of run length or print quality are given, but it is expected that an un-crosslinked polymer such as polysilicic acid will wear off relatively rapidly and give a short run length of acceptable prints.

U.S. Pat. No. 4,081,572 describes a method for preparing a printing master on a substrate by coating the substrate with a hydrophilic polyamic acid and then imagewise converting the polyamic acid to melanophilic polvimide with heat from a flash lamp or a laser. No details of run length, image quality or ink/water balance are given.

U.S. Pat. No. 4,731,317 describes a method for making a litho plate by coating a polymeric diazo resin on a grained anodized aluminum litho support, exposing the image areas with a YAG laser, and then processing the plate with a graphic arts lacquer. The lacquering step is inconvenient and expensive.

Japanese Kokai No. 55/105560 describes a method of preparation of a litho plate by laser beam removal of a hydrophilic layer coated on a melanophilic support, in which a hydrophilic layer contains colloidal silica, colloidal alumina, a carboxylic acid, or a salt of a carboxylic acid. The only examples given use colloidal alumina alone, or zinc acetate alone, with no crosslinkers or addenda. No details are given for the ink/water balance or limiting run length.

WO 92/09934 describes and broadly claims any photosensitive composition containing a photoacid generator, and a polymer with acid labile tetrahydropyranyl groups. This would include a hydrophobic/hydrophilic switching lithographic plate composition. However, such a polymeric switch is known to give weak discrimination between ink and water in the printing process.

EP 0 562 952 A1 describes a printing plate having a polymeric azide coated on a lithographic support, and removal of the polymeric azide by exposure to a laser beam. No printing press examples are given.

U.S. Pat. No. 5,460,918 describes a thermal transfer process for preparing a litho plate from a donor with an oxazoline polymer to a silicate surface receiver. A two sheet system such as this is subject to image quality problems from dust and the expense of preparing two sheets.

In commonly assigned U.S. patent application Ser. No. 08/816,287 filed Mar. 13, 1997 entitled, "METHOD OF IMAGING LITHOGRAPHIC PRINTING PLATES WITH HIGH INTENSITY LASER," now abandoned, a printing plate comprising a support web, a coextensive melanophilic photothermal conversion layer and a melanophilic layer comprising a metal colloid is disclosed. Although this two-layered plate shows greatly enhanced properties, it requires a difficult manufacturing process which is very expensive as it requires at least two passes for the two layers. A more efficient lithographic plate would be useful.

For reasons of cost, it is desirable in certain computer-to-press applications to coat a sensitive layer directly onto the imaging cylinder of a printing press, expose the layer to a writing laser beam, then to operate the printing press for as many impressions as are desired, and then to clean off the sensitive layer and repeat the steps for the next job. This is nearly impossible to accomplish if two or more layers need to be coated to sensitize the imaging cylinder, because of the difficulty of coating uniform layers, and the complications of drying two or more separate layers after coating. It would be desirable to have a single layer coating that could be directly written with a laser to prepare a litho plate without wet processing.

It would be desirable to be able to prepare a single layer litho plate that has high writing sensitivity, high image quality, short roll up, and long run length without any processing. None of the prior art examples can do this satisfactorily.

SUMMARY OF THE INVENTION

The present invention is a lithographic printing plate in which a support web is coated with a crosslinked hydrophilic layer having metal oxide groups and containing a photothermal conversion material. Exposure of this plate to a high intensity laser beam followed by mounting on a press results in excellent impressions without chemical processing and is manufactured inexpensively and is more efficient.

The lithographic printing plate precursor element of this invention comprises:

A. a support web coated with

B. a coextensive hydrophilic layer having an outer hydrophilic surface and a layer thickness, said layer comprising a crosslinked polymeric matrix containing (1) a colloid of an oxide or a hydroxide of a metal selected from the group consisting of beryllium, magnesium, aluminum, silicon, gadolinium, germanium, arsenic, indium, tin, antimony, tellurium, lead, bismuth, transition metals and combinations thereof, and, (2) a photothermal conversion material comprising a radiation absorber, said material being capable of accepting ink upon exposure to high intensity radiation.

The method of making a lithographic printing plate according to this invention comprises I) providing a lithographic printing plate precursor element comprising:

A. a support web coated with

B. a coextensive hydrophilic layer having an outer hydrophilic surface and a layer thickness, said layer comprising a crosslinked polymeric matrix containing (1) a colloid of an oxide or a hydroxide of a metal selected from the group consisting of beryllium, magnesium, aluminum, silicon, gadolinium, germanium, arsenic, indium, tin, antimony, tellurium, lead, bismuth, transition metals and combinations thereof, and, (2) a photothermal conversion material comprising a radiation absorber, said material being capable of accepting ink upon exposure to high intensity radiation; and II) exposing the coextensive hydrophilic layer to high intensity radiation of a laser beam to form ink receptive surface areas on the outer hydrophilic surface.

DETAILED DESCRIPTION OF THE INVENTION

It is a feature of this invention to provide a direct write lithographic printing plate that does not require wet processing.

It is another feature of this invention that the printing plate is cheap and easy to manufacture because it consists of only one coated layer.

The lithographic printing plate comprises: a support web with a coextensive hydrophilic layer comprising a crosslinked polymeric matrix containing a member of the group consisting of colloids of beryllium, magnesium, aluminum, silicon, gadolinium, germanium, arsenic, indium, tin, antimony, tellurium, lead, bismuth and the transition metal oxides, said layer containing a photothermal conversion material capable of accepting ink upon exposure to high intensity radiation. The method of making a lithographic printing plate comprises exposing an element comprising: a) a support web; and b) a single hydrophilic layer comprising a crosslinked polymeric matrix containing a member of the group consisting of colloids of beryllium, magnesium, aluminum, silicon, gadolinium, germanium, arsenic, indium, tin, antimony, tellurium, lead, bismuth and the transition metal oxides, along with a photothermal conversion material capable of accepting ink upon exposure to high intensity radiation.

The lithographic printing plate precursor element as used herein is intended to mean the unimaged element composed of the support web and the coextensive hydrophilic layer.

The support for this invention can be a polymer, metal or paper foil, or a lamination of any of the three. The thickness of the support can be varied, as long as it is sufficient to sustain the wear of the printing press and thin enough to wrap around the printing form. A preferred embodiment uses polyethylene terephthalate in a thickness from 100 to 200 microns. Another preferred embodiment uses aluminum from 100 to 500 microns in thickness. The support should resist stretching so the color records will register in a full color image. The support may be coated with one or more "subbing" layers to improve adhesion of the final assemblage. The back side of the support may be coated with antistat agents and/or slipping layers or matte layers to improve handling and "feel" of the litho plate.

The photothermal conversion material absorbs laser radiation and converts it to heat. It converts photons into heat phonons. To do this it must contain a non-luminescent absorber. Such an absorber may be a dye, a pigment, a metal, or a dichroic stack of materials that absorb by virtue of their refractive index and thickness. In addition to heating the layer, the absorber must have the property of being melanophilic after exposure to the laser. The term "melanophilic" is Greek for ink-loving, i.e., "ink receptive". Since most conventional printing inks are linseed oil based, melanophilic will usually coincide with oleophilic. It will be understood by those skilled in the art that a significant portion of the heat generated by the absorber acts to raise the temperature of the hydrophilic layer to a level where switching to the melanophilic state occurs. The switching of the surface from ink repelling to ink accepting is more easily accomplished when the melanophilic component is present in the layer in the form of particles of many molecules as opposed to molecularly dispersed in the layer. Presumably this is because a molecular dispersion of the two materials gives a surface that has the average ink affinity of the two components, while a particulate dispersion has a surface more nearly like the majority component of the layer. Thus, a layer of crosslinked silica, for example, with about 10% melanophilic absorber present in the form of 1 micron particles has a surface that is over 99% silica, and accepts water and repels ink nearly as well as the pure silica layer. When heated with the laser, the particles become more finely dispersed and the exposed area now accepts ink. Evidently the dispersion of the melanophobic material on or near the surface changes the affinity of the surface for ink sufficiently to enable the printing process, as described in the introductory section of this application. A useful form of particulate radiation absorbers containing a mixture of absorbing dye and melanophilic binder can be made using the evaporative limited coalescence process as described in U. S. Pat. No. 5,234,890, hereby incorporated by reference. As used herein, the "particles" made by evaporative limited coalescence are also termed "microscopic polymeric beads", and the two terms are used interchangeably. A full description of the preparation of evaporative limited coalescence particles and beads is found in U.S. Pat. No. 5,334,575, hereby incorporated by reference. Typically microscopic polymer beads made by this process have particle sizes from about 0.1 micron to about 20 microns. Examples of dyes useful as absorbers for near infrared diode laser beams may be found in U.S. Pat. No. 4,973,572, hereby incorporated by reference. In a preferred embodiment of the invention the absorber is a pigment. In a more preferred embodiment of the invention the pigment is carbon. Other useful absorbers are 2-[2-{2-chloro-3-[1,3-dihydro-1,1,3-trimethyl-2H-benz[e]indo-2-ylidene)ethylidene-1-cyclohexen-1-y}ethenyl]-1,1,3-trimethyl-1H-benz[e]indolium salt of 4-methylbenzene sulfonic acid, bis(dischlorobenzene-1,2-dithiol)nickel(2:1) tetrabutyl-ammonium, and tetrachlorophthalocyanin aluminum chloride, and the like. The size of the particles or beads should not be more than the thickness of the layer. Preferably, the size of the particles will be half the thickness of the layer or less, from about 0.1 microns to about 0.5 microns.

A binder may be used to hold the dye or pigment in the photothermal conversion particle. The binder may be chosen from a large list of film forming polymers. The binder is a melanophilic binder, and typically an oleophilic binder. Such binders are polymeric materials which when cast into a solid form have a surface which is "ink receptive" and typically which is oleophilic. Useful polymers may be found in families of polyurethanes, polycarbonates, polyesters, and polyacrylates of which polyurethanes are preferred. Chemically modified cellulose derivatives are particularly useful, such as nitrocellulose, cellulose acetate propionate, and cellulose acetate. Exemplary polymers may be found in U.S. Pat. Nos. 4,695,286; 4,470,797; 4,775,657; and 4,962,081, hereby incorporated by reference.

Surfactants may be included in the coated layer to facilitate coating uniformity. A particularly useful surfactant for solvent coated polymer layers is Zonyl® FSN surfactant, a surfactant manufactured by the DuPont Company of Wilmington, Del.

In the unexposed areas, the hydrophilic layer is intended to be wetted effectively by the aqueous fountain solution in the lithographic printing process, and when wet, to repel the ink. In addition, it is useful if the hydrophilic layer is somewhat porous, so that wetting is even more effective. The hydrophilic layer must be crosslinked if long printing run lengths are to be achieved, because an un-crosslinked layer will wear away too quickly. Many crosslinked hydrophilic layers are available. Those derived from di, tri, or tetra alkoxy silanes or titanates, zirconates and aluminates are particularly useful in this invention. Examples are colloids of hydroxysilicon, hydroxyaluminum, hydroxytitanium and hydroxyzirconium. Those colloids are formed by methods fully described in U. S. Pat. Nos. 2,244,325, 2,574,902, and 2,597,872. Stable dispersions of such colloids can be conveniently purchased from companies such as the DuPont Company of Wilmington, Del. It is important that the hydrophilic layer have a strong affinity for water. If the hydrophilic layer does not hold enough water, the background areas may carry some ink, commonly referred to as "scumming" of the litho plate. To compensate for this problem, the press operator may have to increase the amount of fountain solution fed to the printing form, and this, in turn, may lead to emulsification of the ink with the fountain solution, resulting in a mottled appearance in solid dark areas. The severity of the problem will depend on the actual ink and fountain solution as well as the press that is being used, but, in general, the more affinity the background of the plate has for water, the fewer printing problems will result. In this invention, it has been found that an overcoat of metal colloids crosslinked with a crosslinker containing ionic groups will hold water and improves the printing performance. In a preferred embodiment of the invention the metal colloid is colloidal silica and the crosslinker is N-trimethoxysilylpropyl-N,N,N-trimethyl ammonium chloride. For the same reason, the hydrophilic layer is most effective when it contains a minimum amount of hydrophobic groups such as methyl or alkyl groups. The thickness of the crosslinking and polymer forming layer may be from about 0.05 to about 1.0 micron in thickness, and most preferably from about 0.1 to about 0.5 micron in thickness. The amount of silica added to the layer may be from 100% to 5000% of the crosslinking agent, and most preferably from 500% to 1500% of the crosslinking agent. Surfactants, dyes, laser absorbers, colorants useful in visualizing the written image, and other addenda may be added to the hydrophilic layer, as long as their level is low enough that there is no significant interference with the ability of the layer to hold water and repel ink.

The layer is coated on the support by any of the commonly known coating methods such as spin coating, knife coating, gravure coating, dip coating, or extrusion hopper coating.

The process for using the resulting lithographic plate comprises the steps of 1) exposing the plate to a focused laser beam in the areas where ink is desired in the printing image, and 2) employing the plate on a printing press. In particular a lithographic printing plate precursor element is provided having a support web coated with a coextensive hydrophilic layer as fully described above. The surface of the coextensive hydrophilic layer is then exposed to high intensity radiation of a laser beam to form ink receptive surface areas on the outer hydrophilic surface of the layer. The imaged plate is then mounted on a conventional lithographic printing press containing a conventional aqueous fountain solution and an oil based ink, and the aqueous fountain solution is applied to the ink receptive surface areas on the outer hydrophilic surface to form a lithographic printing surface consisting of the ink receptive surface areas and complementary ink repellant surface areas. Ink is then applied in the conventional manner adhering only to the ink receptive areas and transferring to print stock during the printing operation. The laser used to expose the lithoplate of this invention is preferably a diode laser, because of the reliability and low maintenance of diode laser systems, but other lasers such as gas or solid state lasers may also be used. No heating, process, or cleaning is needed before the printing operation. A vacuum cleaning dust collector may be useful during the laser exposure step to keep the focusing lens clean. Such a collector is fully described in U.S. Pat. No. 5,574,493. The power, intensity and exposure level of the laser is fully described in the above cross referenced co-pending application.

The following examples illustrate the practice of the invention.

EXAMPLE 1

A mixture of 5% colloidal silica (Nalco 2326 from the Nalco Corporation, Chicago, Ill.) with 1% 3-aminopropyltriethoxysilane, 2% carbon (Cabojet 200 from the Cabot Company, Billerica, Mass.) and 0.1% Zonyl® FSN surfactant (DuPont Company, Wilmington, Del.) was coated at 14 cc per square meter onto a web of 100 microns thick polyethylene terphthalate. During the drying process, the coating was held at 118 degrees C. for 3 minutes. The coating was then exposed to a focused diode laser beam at 830 nm wavelength on an apparatus similar to that described in U.S. Pat. No. 5,446,477. The exposure level was about 600 mJ/square cm, and the intensity of the beam was about 3 mW/square micron. The laser beam was modulated to produce a halftone dot image. After exposure the plate was mounted on an ABDick press and 1000 excellent impressions were made without wear.

Bead Preparation

ELC Bead 1—A solution of 4 g of a melanophilic binder cellulose acetate propionate 482-20 (from Tennessee Eastman Chemicals), 1.5 g of 2-[2-{2-chloro-3-[(1,3-dihydro-1,1,3-trimethyl-2H-benz[e]indol-2-ylidene)ethylidene-1-cylcohexe-1-yl}ethenyl]-1,1,3-trimethyl-1H-benz[e]indolium salt of 4-methylbenzenesulfonic acid in 38 ml of dichloromethane was prepared as the “organic” phase. A mixture of 30 ml of LUDOX collodial silica (DuPont) and 3.3 ml of a copolymer of methylaminoethanol and adipic acid (Eastman Chemical Company) was added to 1000 ml of phthalic acid buffer (pH=4) as the “aqueous” phase. The “organic” and “aqueous” phase solutions were mixed together under high shear conditions using a microfluidizer (Microfluidics Corporation). The organic solvent was then distilled from the resulting emulsion by distillation using a rotovaporizer. The particles were isolated by centrifugation. The isolated wet particles were put into distilled water at a concentration of approximately 10 wt. %. This procedure resulted in an aqueous dispersion of solid beads coated with a thin stabilizing colloidal silica surface, dispersed in a water phase.

ELC Bead 2—Prepared as in ELC Bead 1, but with the melanophilic binder Estane 5799 (Tg=67 degrees C., a polyurethane from B. F. Goodrich) substituted for cellulose acetate propionate.

ELC Bead 3—Prepared as in ELC Bead 1, but with the melanophilic binder Estane 5755P (Tg=11 degrees C.) instead of Estane 5799.

ELC Bead 4—Prepared as in ELC Bead 1, but with the melanophilic binder Estane 5703 (Tg=–31 degrees C.) instead of Estane 5799.

EXAMPLE 2

A web of polyethylene terephthalate was coated with a solution of 30 g of colloidal silica stabilized with ammonia (Nalco 2326) mixed with 58 g of water, 10 g of a 10% dispersion of ELC Bead 1 in water, 0.5 g of aminopropyltriethoxysilane and 0.5 g of 10% Zonyl FSN surfactant (in water), the mixture coated at 33 ml per square meter and dried at 118 degrees C. for 3 minutes to give a direct write printing plate. The plate was exposed as in example 1 and mounted without processing on an ABDick press to give several hundred high quality printed impressions.

EXAMPLE 3

The process of example 2 was used, but with ELC Bead 2 substituted for ELC Bead 1. The results were good.

EXAMPLE 4

The process of example 2 was used, but with ELC Bead 3 substituted for ELC Bead 1. The results were good.

EXAMPLE 5

The process of example 2 was used, but with ELC Bead 4 substituted for ELC Bead 1. The results were good.

EXAMPLE 6

The process of example 2 was used, but with a web of grained and anodized aluminum substituted for the polyethylene terephthalate. The results were good.

EXAMPLE 7

The process of example 1 was used, but with a web of grained and anodized aluminum substituted for the polyethylene terephthalate. The results were good.

The invention has been described in detail, with particular reference to certain preferred embodiments thereof, but it should be understood that variations and modifications can be effected with the spirit and scope of the invention.

What is claimed is:

1. A lithographic printing plate precursor element comprising:

(A) a support web coated with (B) a coextensive hydrophilic layer comprising an outer hydrophilic surface and having a layer thickness, said layer comprising (1) a crosslinked polymeric matrix consisting essentially of a matrix derived from a crosslinker selected from the group consisting of dialkoxysilanes, trialkoxysilanes, tetraalkoxysilanes;

(2) a colloid of silica, the amount of silica in the layer being from 500% to 1500% of the crosslinker; and (3) a photothermal conversion material comprising a radiation absorber, said material being capable of accepting ink upon exposure to high intensity radiation.

2. The element of claim 1 wherein the layer thickness is about 0.05 to about 1.0 micron.

3. The element of claim 1 wherein the radiation absorber is carbon.

4. The element of claim 1 wherein the radiation absorber is a polymeric microscopic bead.

5. The element of claim 4 wherein the bead has a particle size which is half the layer thickness or less.

6. The element of claim 4 wherein the bead has a particle size from about 0.1 microns to about 0.5 microns.

7. The element of claim 4 wherein the bead comprises (1) an oleophilic binder and (2) a dye or a pigment.

8. The element of claim 7 wherein the oleophilic binder is selected from the group consisting of polyurethanes, polycarbonates, polyesters, polyacrylates, nitrocelluloses, cellulose acetate propionates, and cellulose acetates.

9. The element of claim 7 wherein the oleophilic binder is a polyurethane.

10. The element of claim 1 wherein the support web is a polyester film.

11. The element of claim 1 wherein the support web is anodized aluminum.

12. A lithographic printing plate precursor element comprising:

(A) a support web coated with (B) a coextensive hydrophilic layer comprising an outer hydrophilic surface, said layer comprising a crosslinked polymeric matrix containing within the matrix:

(1) a colloid of an oxide or a hydroxide of a metal selected from the group consisting of beryllium, magnesium, aluminum, silicon, gadolinium, germanium, arsenic, indium, tin, antimony, tellurium, lead, bismuth, transition metals and combinations thereof; and, (2) a photothermal conversion material comprising a radiation absorber, said material being capable of accepting ink upon exposure to high intensity radiation;

wherein the crosslinked polymeric matrix consists essentially of a matrix derived from N-trimethoxy-N,N,N-trimethyl ammonium chloride.

13. The element of claim 12 wherein: the radiation absorber is a polymeric microscopic bead having a particle size from about 0.1 microns to about 0.5 microns; the bead comprises an oleophilic binder selected from the group consisting of polyurethanes, polycarbonates, polyesters, polyacrylates, nitrocelluloses, cellulose acetate propionates, and cellulose acetates; and the bead comprises a dye or a pigment.

14. The lithographic printing plate precursor element of claim 12 in which the colloid is silica.

15. A lithographic printing plate precursor element comprising:

(A) a support web coated with (B) a coextensive hydrophilic layer comprising an outer hydrophilic surface, said layer comprising (1) a crosslinked polymeric matrix consisting essentially of a matrix derived from a crosslinker selected from the group consisting of dialkoxysilanes, trialkoxysilanes, and tetraalkoxysilanes;

(2) a colloid of silica; and, (3) a photothermal conversion material comprising a radiation absorber, said material being capable of accepting ink upon exposure to high intensity radiation;

wherein:

the radiation absorber is a polymeric microscopic bead having a particle size from about 0.1 microns to about 0.5 microns;

the bead comprises an oleophilic binder selected from the group consisting of polyurethanes, polycarbonates, polyesters, polyacrylates, nitrocelluloses, cellulose acetate propionates, and cellulose acetates; and the bead comprises a dye or a pigment.

16. The element of claim 15 wherein the crosslinker is N-trimethoxy-silylpropyl-N,N,N-trimethyl ammonium chloride.

17. The element of claim 16 wherein the amount of silica in the layer is from 100% to 5000% of the crosslinker.

18. The element of claim 17 wherein the oleophilic binder is a polyurethane.

19. A method of making a lithographic printing plate comprising

I) providing a lithographic printing plate precursor element comprising:

(A) a support web coated with (B) a coextensive hydrophilic layer comprising an outer hydrophilic surface, said layer comprising:

(1) a crosslinked polymeric matrix consisting essentially of a matrix derived from a crosslinker selected from the group consisting of dialkoxysilanes, trialkoxysilanes, and tetraalkoxysilanes;

(2) a colloid of silica, the amount of silica in the layer being from 100% to 5000% of the crosslinker; and (3) a photothermal conversion material comprising a radiation absorber, said material being capable of accepting ink upon exposure to high intensity radiation; and II) exposing the coextensive hydrophilic layer to high intensity radiation of a laser beam to form ink receptive surface areas on the outer hydrophilic surface.

20. The method of claim 19 wherein the crosslinker is N-trimethoxy-silylpropyl-N,N,N-trimethyl ammonium chloride.

21. The method of claim 19 wherein after step II, an aqueous fountain solution is applied to the outer hydrophilic surface to form a lithographic printing surface consisting of the ink receptive surface areas and complementary ink repellent surface areas.

* * * * *